US00RE36491E

United States Patent [19]

Gilliland et al.

[11] E Patent Number: Re. 36,491

[45] Reissued Date of Patent: Jan. 11, 2000

[54] OPTOELECTRONIC TRANSCEIVER MODULE LASER DIODE STABILIZER AND BIAS CONTROL METHOD

[75] Inventors: Patrick B. Gilliland, Chicago; Andy A. Goryachev, Morton Grove, both of Ill.

[73] Assignee: Methode Electronics, Inc., Chicago, Ill.

[21] Appl. No.: 09/090,057

[22] Filed: Jun. 3, 1998

Related U.S. Patent Documents

Reissue of:

[64] Patent No.: 5,638,390
Issued: Jun. 10, 1997
Appl. No.: 08/508,093
Filed: Jul. 27, 1995

[51] Int. Cl.[7] ..... H01S 3/00

[52] U.S. Cl. ..... 372/38; 372/31; 323/314

[58] Field of Search ..... 372/31, 38; 323/314; 307/297

[56] References Cited

U.S. PATENT DOCUMENTS 4,583,009 4/1986 Eng, Jr. ..... 307/297
4,665,356 5/1987 Pease ..... 323/314
5,019,769 5/1991 Levinson ..... 372/31
5,247,532 9/1993 Levinson ..... 372/38

OTHER PUBLICATIONS

XICOR, X9CMME $E^2$–POT Digitally Controlled Potentiometer, 1992, pp. 1–3.

*Primary Examiner*—Leon Scott, Jr.
*Attorney, Agent, or Firm*—David L. Newman

[57] ABSTRACT

A power stabilizer for maintaining a constant level of output power from a laser transmitter. The laser transmitter has a laser diode which produces an optical output which corresponds to the level of bias current received. In addition, the laser transmitter has a photodiode which produces a feedback signal which corresponds to the optical output power being produced by the laser diode. Furthermore, the power stabilizer consists of a digitally controlled potentiometer for producing a reference input signal and an op-amp for comparing the feedback signal and the reference input signal to produce a control signal to supply bias current.

16 Claims, 3 Drawing Sheets

OPTOELECTRONIC TRANSCEIVER MODULE LASER DIODE STABILIZER AND BIAS CONTROL METHOD

Matter enclosed in heavy brackets [ ] appears in the original patent but forms no part of this reissue specification; matter printed in italics indicates the additions made by reissue.

BACKGROUND OF THE INVENTION

The present invention relates generally to optoelectronic transceiver modules which utilize semiconductor laser diodes for transmitting data, and in particular to a power stabilizer and a stabilization method for biasing the laser diodes.

Optoelectronic transceiver modules provide an interface between an electrical system and an optical transfer medium such as an optic fiber. Correspondingly, most optoelectronic transceiver modules contain electrical and optical conversion circuitry for transferring data both to and from the electrical system and the optical transfer medium.

Normally, transceiver modules use laser diodes, which produce coherent light, for performing high speed data transfers between the electrical system and the optical transfer medium. Typically, each laser diode is packaged with optical power-monitoring circuitry. For example, the RLD-85PC diode package by ROHM, Inc. contains both a laser diode for transmitting data and a photodiode for performing power-monitoring.

The power-monitoring photodiode within the diode packaging provides a monitor current $I_m$ which varies as the optical power being generated by the laser diode changes. Normally, the changes in the monitor current $I_m$ are directly proportional (i.e., linear) to the changes in the optical power generated by the laser diode. However, the ratio of monitor current $I_m$ with regard to the laser diode's optical power can vary widely from one diode package to the next. Therefore, each diode package must be calibrated separately in order to determine its specific ratio of monitor current $I_m$ to laser diode optical power.

The primary purpose of providing a monitor current $I_m$ is for ensuring that, during operation, the laser diode is within its lasing mode of operation. The minimum current which must be supplied to the laser diode to cause lasing is referred to as the threshold current $I_{th}$.

When the current being supplied to the laser diode is less than the required threshold current $I_{th}$, the laser diode is said to be operating in the LED mode. In the LED mode, the current supplied to the laser diode is only sufficient enough to excite atoms in the laser diode's cavity which cause light to be emitted in a manner similar to that produced by light emitting diodes (LEDs).

When the current being supplied to the laser diode reaches a level which is either greater than or equal to the threshold current $I_{th}$, the laser diode's efficiency of converting electrical current into light will increase dramatically and thus the laser diode changes from the LED mode of operation to the lasing mode of operation.

While various classes of laser diodes will have threshold currents in the same general range, the threshold current $I_{th}$ can still vary considerably between laser diodes. For example, the threshold current of some types of laser diodes can vary by as much as fifty percent between their typical and maximum values.

Furthermore, when the laser diode is operating in the lasing mode, there is a characteristic slope that is used to determine the laser diode's output efficiency $\eta$. As commonly known in the art, the output efficiency $\eta$ is defined as the ratio of the changing in the laser diode's optical output power in relation to the changing in the operating current while in the lasing mode. However, as with the monitor current $I_m$, the actual output efficiency $\eta$ varies from one laser diode to another.

Based on the variance in the monitor current $I_m$, the threshold current $I_{th}$, and output efficiency $\eta$ of each laser diode, the operating current range for a given laser diode must be calibrated in order to ensure that the laser diode will always be operating within the lasing mode while transmitting data.

The primary method of ensuring that a laser diode will remain in the lasing mode is to provide the diode with a sufficient bias current. In addition, the laser diode is normally supplied with a second signal which is superimposed onto the bias current and corresponds to the data signals to be transmitted. Thus, the data signals are optically transmitted by the modulation of the laser diode's optical power output which is caused by the superimposing of the data signals onto the bias current. Typically, the bias current and the superimposed data signal are generally referred to as the laser diode's operating current $I_{op}$.

As indicated previously, great care must be taken to ensure that the maximum variation caused by superimposing the data signals onto the bias current will not cause the laser diode's operating current to fall below the required threshold current level $I_{th}$. If the laser diode's operating current falls below the required threshold current level $I_{th}$, then as indicated above, a failure to transmit data will occur because the laser diode will revert to the LED mode of operation.

In addition, besides not going below the threshold current level, the operating current must also be maintained at a sufficiently high enough level that a receiving photodiode can detect the modulated light signal. Furthermore, the laser diode's operating current must not be allowed to go so high as to burn out or significantly reduce the useful life of the laser diode.

Normally, transceivers use an analog feedback loop coupled to a mechanical potentiometer for manually adjusting the laser's output power. The optical power is set by adjusting the reference voltage for the analog feedback loop, via the mechanical potentiometer, until the desired amount of optical output power is achieved.

The use of a mechanical potentiometer for setting the output power level presents many problems due to the electrical characteristics of laser diodes. For example, as indicated above, a laser diode will be destroyed if its optical output power exceeds a certain limit. However, accidentally exceeding the laser diode's power limit by trying to set the bias current is generally quite easy since laser diodes typically have a very sharp optical output efficiently slope $\eta$ once they are in the lasing mode of operation. Thus, losses are commonly caused by adjusting the calibration potentiometer too quickly. Correspondingly, the setup procedure for calibrating laser diodes is generally time consuming and expensive since extreme care must be used in setting the output power via a mechanical potentiometer.

One method proposed for solving the problems of tuning laser diodes is to use a programmed digital controller as set forth by U.S. Pat. No. 5,019,769 which is incorporated herein by reference. The digital controller is used to measure the laser diode's operating characteristics and to control the process of turning on and selecting the operating parameters of the laser diode. However, the use of a digital controller is expensive, consumes additional power, and occupies an inordinate amount of circuit board real estate. Thus, the use of a digital controller is adverse to the wave of inexpensive, low-power, and miniaturized circuitry which is required of today's electrical products.

Furthermore, the use of a digital controller in the control loop (i.e., power stabilizer circuitry) of the laser diode results in adjustments to the laser bias current being made in only certain discrete time intervals, with the time intervals being defined by the operating speed of the digital controller and its software algorithm. Accordingly, the use of a digital controller cannot immediately compensate for power fluctuations which may occur in the optical power output of the laser diode due to power spikes, noise, and other variations in the system.

In view of the above, it is an object of the present invention to provide an optoelectronic transceiver which employs a power stabilization and a stabilization method for efficiently biasing the operating current supplied to a laser diode.

It is another object of the present invention to prevent the destruction of a laser diode during calibration of the output power.

It is still another object of the present invention to provide a cost effective and automated means for selecting the bias current supplied to a laser diode.

A further object of the present invention is to provide a means for biasing a laser diode while minimizing the amount of circuit board space required for such laser diode biasing.

A still further object of the present invention is to provide a stable means for laser diode biasing.

Another object of the present invention is to immediately compensate for power fluctuations which may occur in the optical power output of a laser diode.

Furthermore, other objects, features, and advantages of the present invention will be apparent from the following detailed description taken in connection with the accompanying drawings.

SUMMARY OF THE INVENTION

In one form of the invention, a power stabilizer is provided for maintaining a constant power level from a laser transmitter. The laser transmitter has a laser diode which produces an optical output which corresponds to the level of bias current received. In addition, the laser transmitter has a photodiode which produces a feedback signal which corresponds to the optical output power being produced by the laser diode. Furthermore, the power stabilizer consists of a digitally controlled potentiometer for producing a reference input signal and an op-amp for comparing the feedback signal with the reference input signal to produce a control signal to supply bias current.

In a further embodiment, the invention also includes a bias current drive transistor which supplies bias current when the control signal is received. In addition, the control signal may be filtered by an RC circuit or an integrator.

In addition, the invention also provides for a method of maintaining a constant level of output power from a laser transmitter wherein the laser transmitter has a laser diode and a photodiode. The laser transmitter's laser diode produces an optical output power which corresponds to the level of bias current received. In addition, the laser transmitter's photodiode produces a feedback signal which corresponds to the amount of optical output power produced by the laser diode. Based on the above, the method consisting of: (1) setting the resistance of a digitally controlled potentiometer to produce a reference input signal at a specific voltage level; and (2) comparing the feedback signal with the reference input signal to produce a control signal to supply bias current to a laser diode.

Various means for practicing the invention and other advantages and novel features thereof will be apparent from the following detailed description of an illustrative preferred embodiment of the invention.

BRIEF DESCRIPTION OF THE DRAWINGS

There is shown in the drawing a presently preferred embodiment of the present invention, wherein like numerals in the various figures pertain to like elements, and wherein.

DETAILED DESCRIPTION OF THE PRESENTLY PREFERRED EMBODIMENTS

Figure 1:
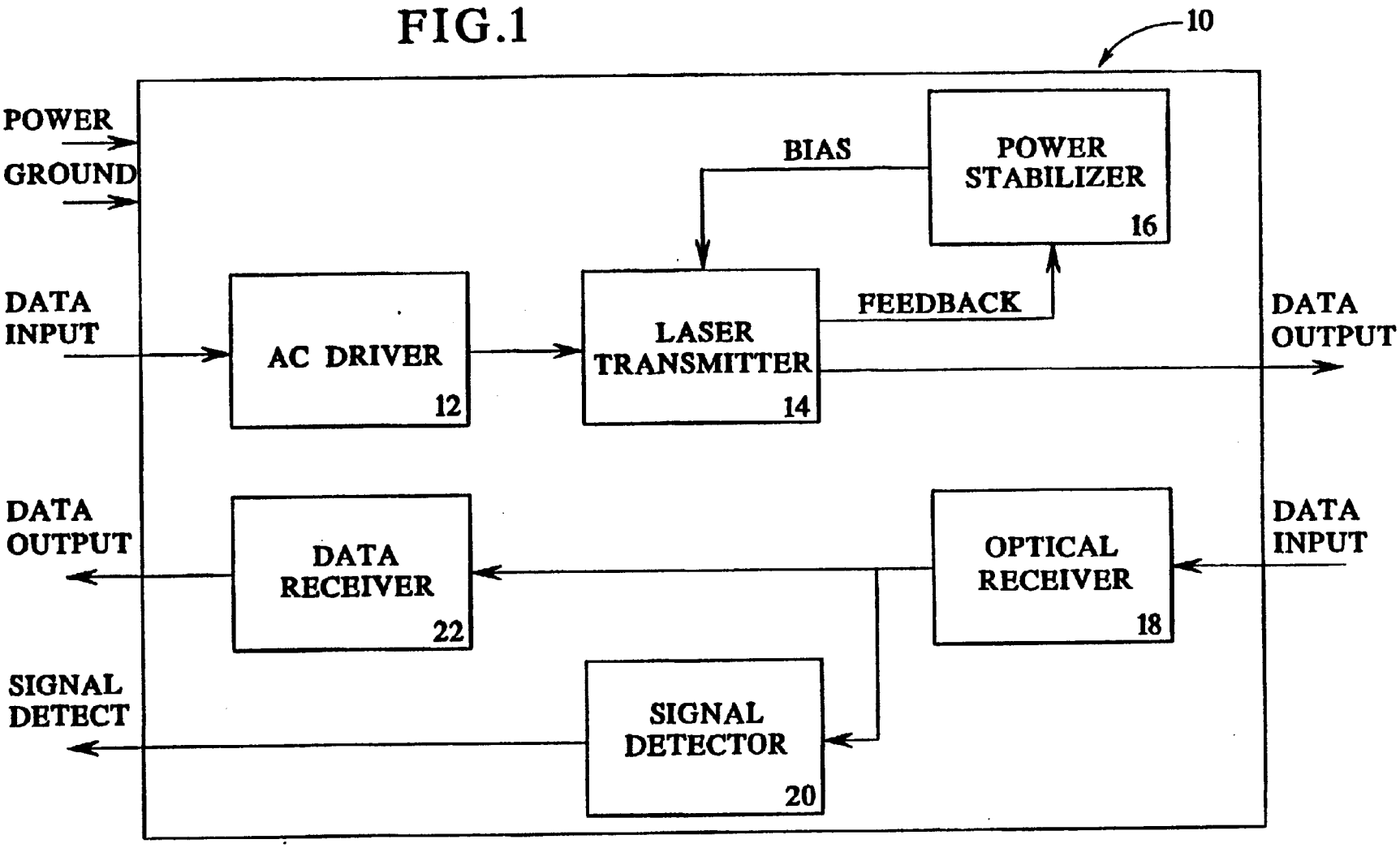
FIG. 1 is a functional block diagram of a transceiver module.

Referring to the drawing, and particularly to FIG. 1, a functional block diagram of a transceiver module 10 is depicted with an AC driver 12, laser transmitter 14, power stabilizer 16, optical receiver 18, signal detector 20, and data receiver 22. Within the functional bock diagram a single block may indicate several individual circuits which collectively perform a single function; a single line (for example, "data input" to the AC driver 12) may indicate a set of similar electrical connections or signals which collectively perform a single function or transmit a similar collection of data. From this level of description, it would be clear to one of ordinary skill in the art, after perusal of the specification, drawing, and claims herein, how to make and use the invention, without undue experimentation.

The AC driver 12, laser transmitter 14, and power stabilizer 16 shown in FIG. 1 provide the electrical-to-optical conversion circuitry required to transfer data from an electrical system to an optical transfer medium. The AC driver 12 receives data input, in the form of electrical signals, and supplies a corresponding data signal to the laser transmitter 14 for transmittal onto the optical transfer medium. Furthermore, the laser transmitter 14 receives a bias signal from the power stabilizer 16 and transmits a corresponding monitor (i.e., feedback) signal in order to keep the laser transmitter 14 within the lasing mode of operation.

Turning to the portion of the transceiver module 10 which provides for optical-to-electrical signal conversion, the required circuitry consists of the optical receiver 18, signal detector 20, and data receiver 22 which are of standard construction. The optical receiver 18 is used to receive data signals, in the form of optical signals, from an optical transfer medium. The optical signals which are received by the optical receiver 18 are converted into electrical signals by conventional means such as a photodiode. The optical receiver 18 then transmits the electrical signals to both the data receiver 22 and the signal detector 20.

Furthermore, the electrical signals received by the signal detector 20 are used to provide a signal detect output which indicates when optical power is sufficient to allow for proper detection and conversion of optical signals into electrical data by the transceiver 10. Likewise, the signals received by the data receiver 22 are processed for transmission as data output, in the form of electrical signals.

Since transceiver modules are well known in the art, no further explanation is provided of the circuitry or methodology of the transceiver circuitry required to convert optical signals into electrical signals. Conversely, the conversion of electrical signals into optical signals in accordance with the present invention is further described below.

Figure 2:
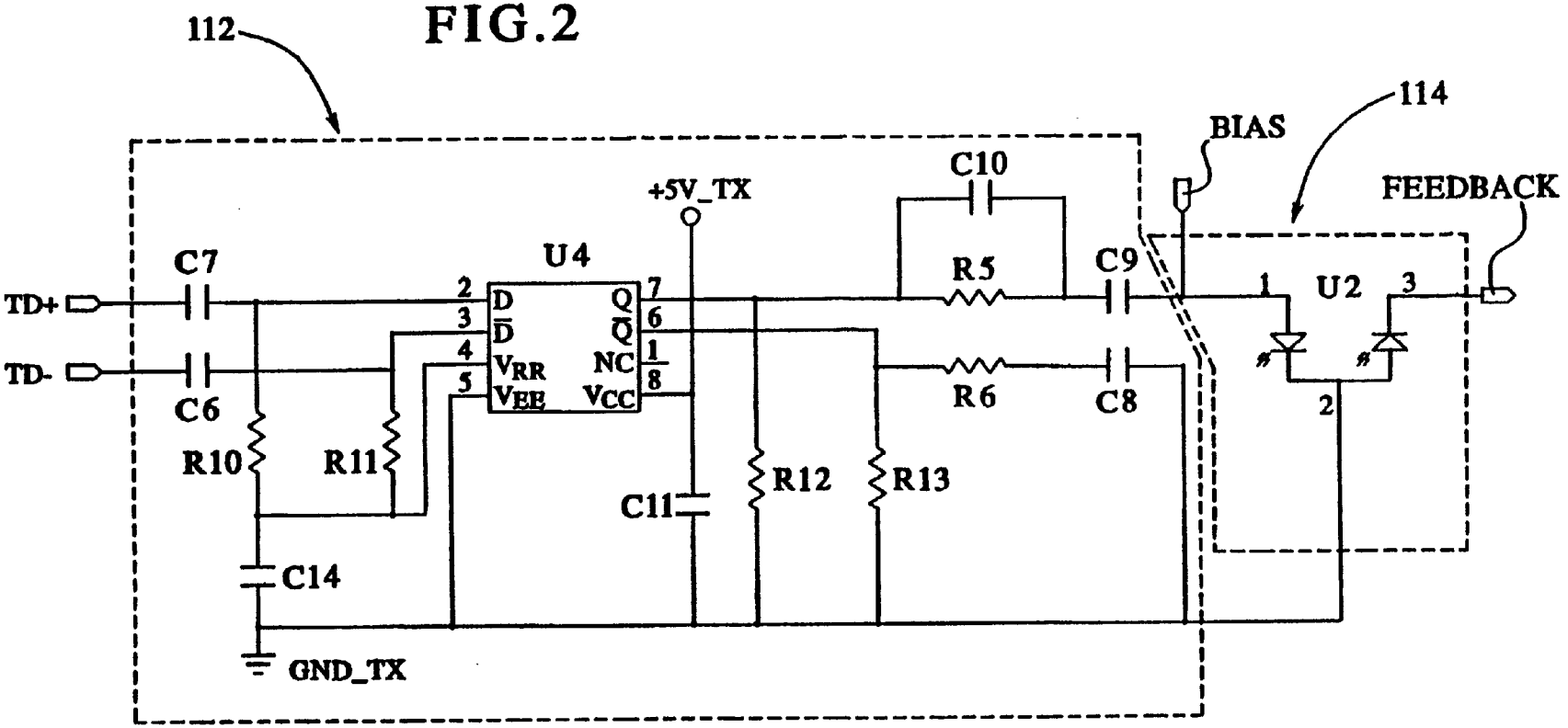
FIG. 2 is a detailed schematic circuit diagram of an AC driver and a laser transmitter constructed in accordance with the present invention.

Turning to FIG. 2, the preferred embodiment of the circuitry required for the AC driver 112 and the laser transmitter 114 is depicted. The AC driver 112 is shown to consist of a differential receiver U4 for receiving electrical data signals at the differential input terminals labeled TD+ and TD−. Likewise, the differential receiver U4 supplies a data signal to pin 1 of the laser diode U2 which corresponds to the logic levels supplied to the inputs TD+and TD−. Both of the differential inputs TD+ and TD− are provided with blocking capacitors C7 and C6, respectively, which provide for the AC coupling of the input signal paths associated with the differential receiver U4. Furthermore, each of the input signal paths to U4 are connected to resistors R10 and R11, respectively, which have their opposite ends connected to a grounded capacitor C14. Both the resistors R10,R11 and the capacitor C14 provide for AC termination of the input signals TD+ and TD−.

As previously indicated above, the differential outputs of the differential receiver U4 are provided by pins 7 and 6. Pin 6 of the differential receiver U4 is connected to resistors R13 and R6 with resistor R6 being tied to ground and resistor R13 being tied to a grounded capacitor C8. The resistors R13,R6 and the capacitor C8 provide for the proper termination of the signal transmitted by pin 6 of the differential receiver U4. Resistors R12 and R13 provide necessary pull down of the U4 outputs.

Correspondingly, pin 7 of the differential receiver U4 is connected to a resistor R5 and a capacitor C10 with the other ends of both the resistor R5 and the capacitor C10 being tied to capacitor C9. Furthermore, the opposite end of the capacitor C9 is tied to the anode of the laser diode U2. The combination of R5, C10, and C9, provides for a termination impedance matched with the output pin 6 of the differential receiver U4 and for the attenuation of the output signal transmitted by pin 7. The attenuation of the output signal provided by pin 7 allows for the data signal to be superpositioned on the bias current as described further herein while still providing adequate optical power modulation without causing the laser diode to revert to the LED mode. Furthermore, capacitor C9 provides for decoupling of the output signal provided by U4 so that only the AC component of the data signal will be provided to the anode of the laser diode U2.

Figure 3:
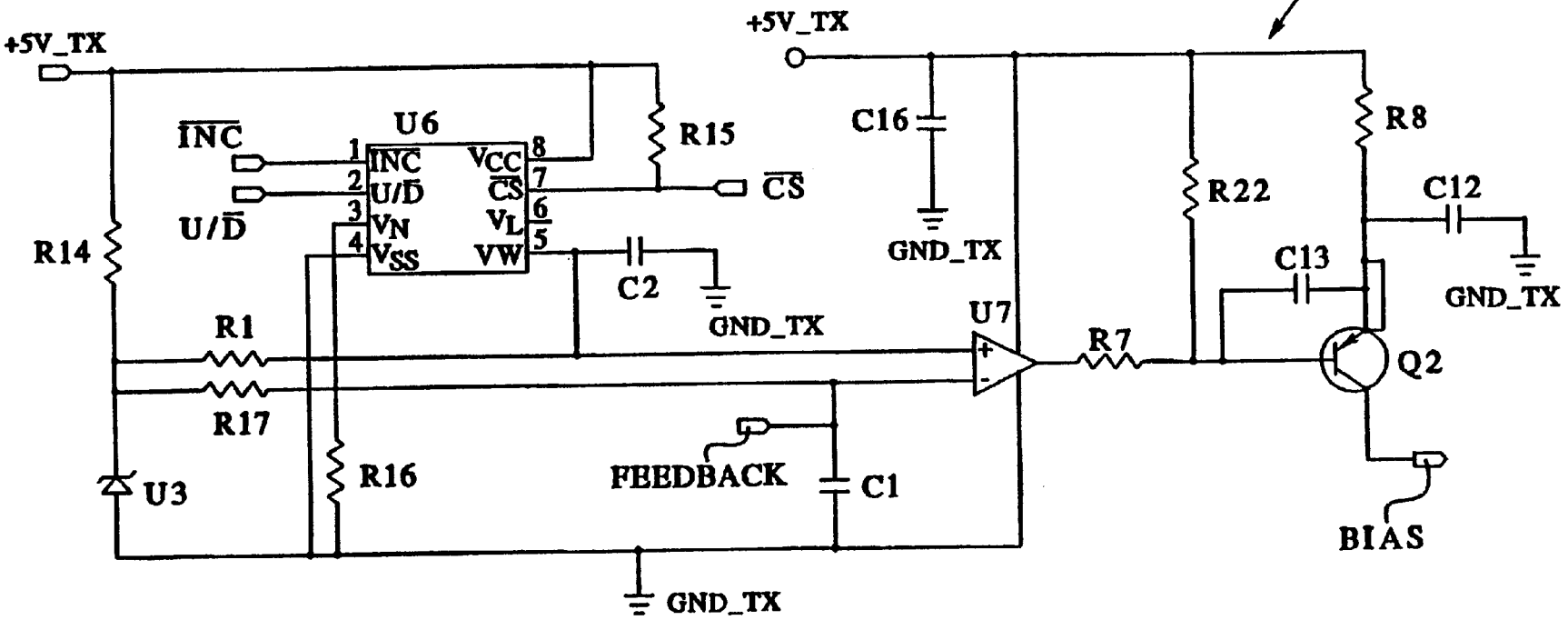
FIG. 3 is a detailed schematic diagram of a power stabilizer constructed in accordance with the present invention.

Also connected to the anode of the laser diode U2 is a bias current signal from the power stabilizer circuitry 116 shown in FIG. 3. The bias current signal, as described above, consists of a variable current which ensures that the laser diode U2 will continuously operate in the lasing mode of operation. The power stabilization circuitry 116 is used to generate the bias current signal as described further herein. In addition, the power stabilization circuitry 116 requires a monitor current signal (i.e., feedback) from the laser transmitter 116. Correspondingly, as indicated above, both the laser diode and the photodiode shown in FIG. 2 are provided by U2. The cathode of the laser diode is tied to ground along with the anode of the photodiode. Thus, the reverse biased photodiode U2 is used to provide the monitor current signal (i.e., feedback signal) to the power stabilizer circuitry 116.

Referring back to FIG. 3, a detailed schematic diagram of a power stabilizer 116 constructed in accordance with the present invention is provided. As stated above, the power stabilizer 116 monitors the feedback signal provided by the photodiode U2 and thus produces a corresponding bias current to the laser diode U2. As shown in FIG. 3, the power stabilizer 116 uses an operation amplifier U7 (i.e., "op-amp"), which is configured to operate like a high gain difference amplifier, to monitor the feedback signal. The output of the op-amp U7 is used to provide a corresponding signal which controls the bias current supplied to the laser diode U2. Thus, when the output voltage of the op-amp decreases, the bias current to the laser diode U2 will be increased. Likewise, when the output voltage of the op-amp increases, the bias current to the laser diode U2 will be reduced.

Attached to the non-inverting and inverting inputs of op-amp U7 are resistors R1 and R17, respectively. The opposite ends of resistors R1 and R17 are tied to a +2.5 voltage reference which is provided by the reverse biased reference diode U3.

Also attached to the inverting input of the op-amp U7 is the monitor current signal (i.e., feedback signal) from the photodiode U2 along with a capacitor C1 which is tied to ground. The capacitor C1 provides for the removal of the modulated signal current provided by the differential receiver U4, via capacitor C9, and also provides for a "soft start" in supplying bias current to the photodiode U2 during initial power on. Thus, after power on, capacitor C1 ensures that the op-amp U7 will only respond to changes in the bias current and thus the capacitor C1 removes the effect of the AC portion of the optical signal detected by the monitor photodiode U2.

Furthermore, since the feedback signal generated by the photodiode U2 will cause a voltage drop across R17, the resistor R17 and the +2.5 voltage reference diode U3 provide a means for generating a feedback input signal at the inverting input of the op-amp U7 which corresponds to the level of feedback generated by the photodiode U2.

Likewise, attached to the non-inverting input of the op-amp U7 is the wiper terminal VW (i.e., pin 5) of a digitally controlled potentiometer U6 which provides a means for producing a reference input signal voltage to the non-inverting input of the op-amp U7. Also capacitor C2 is connected to the op-amp non-inverting input. This capacitor prevents reference diode noise from being amplified by the op-amp U7. In the preferred embodiment, the digitally controlled potentiometer U6 operates as a resistor array which consists of 99 resistive elements with tap points being located between each resistive element and accessible by the wiper.

The position of the wiper is controlled by the chip select input -CS (i.e., pin 7), up/down input U/-D (i.e., pin 2), and increment input -INC (i.e., pin 1) of the potentiometer U6. In the preferred embodiment, the increment input -INC and the up/down input U/-D are unconnected. Additionally, the chip select input -CS is connected to a pullup resistor R15 which is connected to +5 volts.

The digitally controlled potentiometer U6 also has a high terminal VH (i.e., pin 3) and a low terminal VL (i.e., pin 6) which are equivalent to the fixed terminals of a mechanical potentiometer. In the preferred embodiment, the low terminal VL of the potentiometer U6 is unconnected and the high terminal VH is tied to a resistor R16 which is connected to ground.

With the potentiometer U6 connected as described above, the potentiometer provides for resistance trimming of the total resistance between the non-inverting input of the op-amp U7 and ground. Controlling the ratio of R1:[R16+U6] sets the voltage of the reference input signal seen at the non-inverting input of the op-amp U7. It is preferred that the maximum resistance provided by the potentiometer be 10K ohms. Therefore, the digital potentiometer U6 provides resistance values in increments of 101 ohms since, as described above, the potentiometer provides a resolution which is equal to the maximum resistance value divided by 99. In addition, since the high terminal VH of the potentiometer U6 is tied to resistor R16, the resistance provided at the wiper terminal VW is equal to the value selected by the digital controlled potentiometer U6 plus the resistance value of R16.

In the preferred embodiment, the potentiometer U6 consists of the X9C103 digitally controlled potentiometer manufactured by XICOR. Compared to a digital controller as prescribed by U.S. Pat. No. 5,019,769, the use of a digital potentiometer requires the use of substantially less circuit board area. Furthermore, the digitally controlled potentiometer is less expensive, less complex, and thus more cost effective, than using a complex digital microprocessor.

Referring to the output of op-amp U7, the op-amp's output is connected to a resistor R7 which is connected to a pullup resistor R22, a capacitor C13, and the base of a PNP transistor Q2. Furthermore, the opposite ends of the pullup resistor R22 and the capacitor C13 are connected to +5 volts and the emitter of the PNP transistor, respectively.

The pullup resistor R22 turns transistor Q2 off when the output voltage of op-amp U7 reaches its maximum. In addition, resistors R7 and R22, along with capacitor C13, result in an RC filter with a time constant on the order of 50 nsec. Furthermore, the emitter of the transistor Q2 is also tied to a resistor R8 and a capacitor C12 which are connected to +5 volts and ground, respectively. The resistor R8 and capacitor C12 are use to provide filtering of the +5 volts supplied to the emitter of transistor Q2. In addition, the collector of the PNP transistor Q2 is used to provide the bias current to the laser diode U2.

As indicated above, before the laser transmitter 114 is ready to begin transmitting data, the bias current to the laser diode must initially be set. The laser diode output power level is set by adjusting the resistance of the digital controlled potentiometer U6. To adjust the wiper resistance of the potentiometer U6, the device is selected by pulling the potentiometer's chip select -CS input (i.e., pin 7) to a low logic level. Once the -CS input is pulled low, the -INC input (i.e., pin 1) is used to either increase or decrease the resistance at the wiper terminal VW, while the output power of the laser diode is monitored by a calibrated power meter. Correspondingly, the resistance is increased by pulling the U/-D input to a high logic level and, conversely, the resistance is decreased by pulling the U/-D input to a low logic level. This procedure allows the operator to set the laser output power level via control of the digital potentiometer.

Once the laser power is selected, the resistor U15 is allowed to pull the chip select input -CS of the potentiometer U6 to a high logic level. Furthermore, in the preferred the embodiment, the potentiometer U6 has a nonvolatile memory so that it is capable of storing the position of the wiper. Therefore, the same wiper position will be maintained upon a subsequent power-on operation.

Correspondingly, in a preferred embodiment, the position of the wiper in the potentiometer U6 is pre-set by its manufacturer so that the highest resistance value is provided, via the wiper terminal VW, when power is first applied to the potentiometer. Therefore, only minimal bias current will be supplied to the laser diode U2 when power is first applied to the stabilizer circuitry 114.

In the preferred embodiment, the optical power output of the laser diode is measured by conventional means as known by those persons skilled in the art. Furthermore, since the optical power of the laser diode corresponds to the feedback supplied by the power stabilization circuitry 116, the potentiometer U6 allows for the power stabilization circuitry 116 to be adjusted so that it provides a specific bias current which corresponds directly to the feedback.

Using the digitally controlled potentiometer U6 to adjust the voltage of the reference input signal, and thus the bias current supplied by the power stabilizer circuitry 116, will eliminate the possibility of accidently destroying the laser diode U2 and provides for a stable means of setting the laser output power. The laser output power can be effectively set since the resistance of the potentiometer U6 cannot be adjusted without supplying toggled signals to the -INC input. Therefore, the reference input signal, and thus the corresponding optical power output of the laser diode, cannot be accidentally adjusted since only deliberate steps will cause changes to the voltage level of the reference input signal.

In addition, the use of a digital potentiometer allows for the automatic adjustment of the reference voltage and therefore the laser output power. Automatic adjustments can be accomplished by having a device, such as a properly calibrated optical power meter traceable to the standards established by the National Institute of Standards and Technology (NIST), receive the optical output power from the laser diode U2 and, based on the level of optical output power measured, a device such as a computer or microprocessor can transmit control signals to the potentiometer U6 to either increase or decrease the optical power output of the laser diode U2 accordingly.

Operationally speaking, the power stabilization circuit 116 will either increase or decrease the bias current supplied to the laser diode depending, respectively, on if the feedback signal supplied by the photodiode U2 is too low or too high. As depicted in FIG. 3 and indicated above, the feedback signal effectively governs the inverting input received by the op-amp U7. In addition, the voltage level at the non-inverting input of op-amp U7 (i.e., the reference input signal) is selected by adjusting the potentiometer U6 as described above. Therefore, a comparison of the feedback signal and the reference input signal determines the output voltage level of op-amp U7.

Consequently, the PNP transistor Q2 will increase the bias current to the laser diode U2 as the output voltage level of the op-amp U7 decreases due to the feedback signal being too low. Likewise, the transistor Q2 will decrease the bias current to the laser diode U2 as the output voltage level of the op-amp U7 increases due to the feedback signal being too high.

It should be noted that the bias current supplied by the collector of transistor Q2 will only be gradually changed due to the RC circuitry provided by R7, R22, and C13 on the output of op-amp U7. Furthermore, as stated above, the feedback generated by the photodiode U2 will vary directly with changes in the optical power being generated by the laser diode U2.

Consequently, the use of analog circuitry in the power stabilizer as described above provides for the immediate compensation of power fluctuations which may occur in the optical power output of a laser diode.

Once the resistance of the digital potentiometer U6 is set to the correct level, the AC driver 112 and laser transmitter 114 are ready to convert electrical data input signals into optical data output signals. As shown in FIG. 2, the AC driver 112 receives differential data input signal via inputs TD+ and TD−. The data input signals TD+ and TD− are AC coupled by capacitors C6 and C7, received by the differential receiver U4, and terminated by R10, R11, and C14. The data input signals received by the differential receiver U4 are then transmitted via pins 6 and 7.

Output pin 6 of the differential receiver U4 is terminated by resistors R13, R6, and capacitor C8. Likewise, output pin 7 of the differential receiver U4 is attenuated by resistor R5 and capacitor C10. Furthermore, the output provided by pin 7 is AC coupled by capacitor C9 so that only the AC component of the output signal, which directly corresponds to the electrical signal received by the AC driver, is superimposed onto the bias current signal used to drive the laser diode U2. Therefore, the optical power output of the laser diode will vary in accordance with the electrical signals received by the AC driver and will be transmitted as data output over an optical medium such as an optic fiber.

For completeness in the disclosure of the above-described AC driver 112, laser transmitter 114, and power stabilizer 116, but not for purposes of limitation, the following representative values and component identifications are submitted. These values and components were employed in a transceiver that was constructed and tested and which provides a high quality performance. Those skilled in the art will recognized that many alternative elements and values may be employed in constructing the circuitry in accordance with the present invention.

| Part | TYPE or VALUE |
|---|---|
| C1 | .1 uF |
| C2 | .1 uF |
| C6 | .1 uF |
| C7 | .1 uF |
| C8 | .1 uF |
| C9 | .1 uF |
| C10 | 5 pF |
| C11 | .1 uF |
| C12 | .1 uF |
| C13 | 100 pF |
| C14 | .1 uF |
| C16 | .1 uF |
| R1 | 100 Ohms |
| R5 | 46.4 Ohms |
| R6 | 51 Ohms |
| R7 | 1K Ohms |
| R8 | 26.7 Ohms |
| R10 | 51 Ohms |
| R11 | 51 Ohms |
| R12 | 180 Ohms |
| R13 | 180 Ohms |
| R14 | 1K Ohms |
| R15 | 1K Ohms |
| R16 | 1K Ohms |
| R17 | 100 Ohms |
| R22 | 1K Ohms |
| Q2 | MRF5211 |
| U2 | RLD-85PC |
| U3 | LM40400IM3-25 |
| U4 | MC100EL16 |
| U6 | X9C103 |
| U7 | TA75S01F |

Although the above power stabilizer 116 depicted in FIG. 3 is used in a transceiver module, it should be understood that the power stabilizer could be used in any application where a laser diode is used for transmitting optically encoded data onto an optical transfer medium.

Furthermore, it should also be understood that other various changes and modifications to the presently preferred embodiment described herein will be apparent to those skilled in the art. Such changes and modifications may be made without departing from the spirit and scope of the present invention and without diminishing its attendant advantages. For example, the digitally controlled potentiometer can be constructed using various discrete components. Therefore, it is intended that such changes and modifications be covered by the appended claims.

We claim:

1. A power stabilizing circuit for maintaining a constant level of output power from a laser transmitter, wherein said laser transmitter includes a laser diode configured to emit an optical output signal having an output power level corresponding to a bias current input to said laser diode, and a photodiode for monitoring said optical output signal, providing a voltage feedback signal proportional to said output power level, said power stabilizing circuit comprising:

a) a digitally controlled potentiometer, said potentiometer including a wiper contact having a variable output resistance for supplying an adjustable voltage reference signal;

b) an op-amp having first and second inputs, said adjustable voltage reference signal connected to said first input, and said voltage feedback signal connected to said second input, such that said op-amp compares said voltage reference signal and said voltage feedback signal to generate an output control signal corresponding to the voltage difference between said first and second input; and c) a bias current driver driven by said output control signal for supplying said bias current to said laser diode.

2. The power stabilizing circuit of claim 1, wherein said current driver comprises a current drive transistor, having a base electrically connected to said output control signal, a collector connectted to said laser diode, and an emitter connected to a voltage source, whereby said transistor provides a bias current to said laser diode inversely proportional to said output control signal.

3. The power stabilizing circuit of claim 2, further comprising an RC filter disposed between said op-amp and said transistor such that said output control signal is filtered prior to connection to said base of said transistor.

4. The power stabilizing circuit of claim 1 wherein said potentiometer provides resistance trimming of said adjustable voltage reference signal by selectably altering said output resistance in a number of incremental steps between a maximum resistance value and zero ohms.

5. The power stabilizing circuit of claim 4 wherein said maximum resistance is 10k ohms.

6. The power stabilizing circuit of claim 4 wherein said number of incremental steps equals ninety-nine.

7. An apparatus for transmitting electrical data signals onto an optical transfer medium, said apparatus comprising:

a) an AC driver for receiving said electrical data signals and providing a corresponding data signal;

b) a laser transmitter having a laser diode and a photodiode, said laser diode for producing optical power modulated by said data signal and transmittable over said optical transfer medium, and said photodiode for producing a feedback signal proportional to said optical output power produced by said laser diode; and c) a power stabilizing circuit comprising;

i) a digitally controlled potentiometer for producing a reference input signal;

ii) an op-amp for comparing said feedback and said reference input signal, said op-amp generating a output control signal; and iii) a bias current drive transistor, responsive to said control signal, for supplying said bias current to said laser diode.

8. A method of maintaining a constant level of output power from a laser transmitter, comprising the steps of:

a) providing a laser transmitter having a laser diode and a photodiode, said laser diode responsive to a reference voltage input which produces a level of bias current to produce a corresponding level of optical output power and said photodiode responsive to said optical output signal to produce a feedback signal which corresponds to said optical output power produced by said laser diode;

b) setting the resistance of a digitally controlled potentiometer to produce a reference input signal; and c) comparing said feedback signal and said reference input signal to produce a control signal to supply said bias current.

*9. An apparatus for transmitting electrical data signals over an optical transfer medium; comprising:*

*an AC driver circuit receiving said electrical data signals, generating a voltage signal based on said electrical data signals, and generating an AC data signal from said voltage signal;*

*a laser transmitter having a laser diode and a photodiode, said laser diode producing optical power modulated by said AC data signal and transmittable over said optical transfer medium, said photodiode producing a feedback signal based on said optical output power produced by said laser diode; and*

*a power stabilizing circuit including a comparator, a digitally controlled potentiometer and a bias current drive transistor, said comparator having inputs for each of said feedback signal and a voltage reference signal wherein said comparator compares said feedback signal and said voltage reference signal to generate an output control signal, said digitally controlled potentiometer operatively coupled to permit adjustment of one of said inputs for corresponding adjustment of said output control signal, and said bias current drive transistor responsive to said output control signal for supplying a bias current to said laser diode.*

*10. The apparatus as claimed in claim 9, wherein said comparator comprises an operational amplifier.*

*11. The apparatus as claimed in claim 9, wherein said digitally controlled potentiometer is operatively coupled to adjust a voltage of said feedback signal.*

*12. The apparatus as claimed in claim 9, wherein said digitally controlled potentiometer is operatively coupled to adjust a voltage of said voltage reference signal.*

*13. The apparatus as claimed in claim 9, further comprising:*

*a differential receiver in said AC driver circuit, said differential receiver comprising a pair of differential inputs for receiving said electrical data signals and an output via which said voltage signal is generated.*

*14. The apparatus as claimed in claim 13, further comprising:*

*a resistor electrically connected in series with said output of said differential receiver in said AC driver circuit; and*

*a capacitor electrically connected in parallel to said resistor.*

*15. The apparatus as claimed in claim 13, further comprising:*

*a pair of blocking capacitors, each blocking capacitor electrically connected to one of the inputs of said differential receiver.*

*16. A method of maintaining a constant level of output power from a laser transmitter, comprising the steps of:*

*providing a laser transmitter having a laser diode and a photodiode, said laser diode responsive to an output control signal which supplies a level of bias current to produce a corresponding level of optical output power, said photodiode responsive to said optical output power to produce a feedback signal which corresponds to a level of said optical output power;*

*receiving electrical data signals in an AC driver circuit;*

*generating a voltage signal in said AC driver circuit based on said electrical data signals;*

*generating said AC data signal from said voltage signal in said AC driver circuit;*

*modulating said optical output power with said AC data signal;*

*comparing said feedback signal and a voltage reference signal to produce said output control signal; and*

*adjusting the resistance of a digitally controlled potentiometer to adjust said output control signal.*

* * * * *